US006921955B2

(12) United States Patent
Goto

(10) Patent No.: US 6,921,955 B2
(45) Date of Patent: Jul. 26, 2005

(54) NOISE-PROOF SEMICONDUCTOR DEVICE HAVING A HALL EFFECT ELEMENT

(75) Inventor: Hirokazu Goto, Tokyo (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 10/745,261

(22) Filed: Dec. 23, 2003

(65) Prior Publication Data

US 2004/0135220 A1 Jul. 15, 2004

(30) Foreign Application Priority Data

Dec. 25, 2002 (JP) ........................................ 2002-374629

(51) Int. Cl.[7] .............................................. H01L 29/82
(52) U.S. Cl. ...................................... 257/427; 257/659
(58) Field of Search ................................ 257/421, 422, 257/427, 659, E43.002, E43.003, E27.005

(56) References Cited

U.S. PATENT DOCUMENTS

| | | | | | |
|---|---|---|---|---|---|
| 4,709,214 | A | * | 11/1987 | Higgs | 330/6 |
| 5,552,700 | A | * | 9/1996 | Tanabe et al. | 324/117 H |
| 5,627,398 | A | * | 5/1997 | Zlebir et al. | 257/427 |
| 6,300,168 | B1 | * | 10/2001 | Takeuchi | 438/122 |
| 6,424,018 | B1 | | 7/2002 | Ohtsuka | 257/421 |
| 6,462,531 | B1 | | 10/2002 | Ohtsuka | 324/117 H |
| 6,492,697 | B1 | * | 12/2002 | Plagens et al. | 257/426 |
| 6,545,456 | B1 | * | 4/2003 | Radosevich et al. | 324/117 H |
| 2002/0011841 | A1 | * | 1/2002 | Goto et al. | 324/251 |
| 2002/0024109 | A1 | * | 2/2002 | Hayat-Dawoodi | 257/421 |

* cited by examiner

*Primary Examiner*—George Eckert
*Assistant Examiner*—Matthew E. Warren
(74) *Attorney, Agent, or Firm*—Woodcock Washburn LLP

(57) ABSTRACT

A noise-proof, integrated semiconductor current detector is disclosed which has formed in a semiconductor substrate a Hall generator for providing a Hall voltage in proportion to the strength of a magnetic field applied, a control current supply circuit for delivering a control current to the Hall generator, and a Hall voltage output circuit for putting out the Hall voltage for detection or measurement. The Hall generator, control current supply circuit, and Hall voltage output circuit are all exposed at one of the pair of opposite major surfaces of the semiconductor substrate. A current-path conductor is attached to this one major surface of the substrate via insulating layers for carrying a current to be detected. A shielding layer of highly electroconductive material is interposed between the current-path conductor and the substrate for protecting all of the Hall generator, control current supply circuit, and Hall voltage output circuit from noise from the current-path conductor as well as from external disturbances.

8 Claims, 4 Drawing Sheets

NOISE-PROOF SEMICONDUCTOR DEVICE HAVING A HALL EFFECT ELEMENT

BACKGROUND OF THE INVENTION

This invention relates to a semiconductor device incorporating both a Hall effect element and some other active component or components that are needed in use of the device as current detector or the like. More specifically, the invention pertains to how to improve the noise immunity of such a device.

The Hall effect element or Hall generator works on the Hall effect to give an output voltage proportional to the strength of the magnetic field applied. Therefore, when placed along a current path, the Hall generator provides a voltage proportional to the magnitude of the current flowing through the path, as the current of variable magnitude creates a magnetic field of correspondingly varying strength that acts on the Hall generator.

Usually, the current detector utilizing the Hall effect is fabricated as an integrated circuit, with the Hall generator formed in a unitary semiconductor substrate in combination with a Hall voltage detector circuit and an amplifier circuit. U.S. Pat. No. 6,424,018 describes and claims an integrated Hall current detector designed for higher sensitivity. This prior art device has a current path in the form of an electrically conductive layer overlying a film of electrically insulating material on a major surface of a semiconductor substrate having a pair of Hall generators formed in juxtaposition therein.

The noted prior art device has proved to have a weakness arising from the positioning of the current-path conductor layer in close proximity of the Hall generators. Not only the Hall generators but the other active components of the device were arranged so close to the current path that they were prone to give rise to errors. Such errors were easy to occur because of voltage fluctuations in the current path which manifested themselves as undesired variations in voltage between the output terminals of the Hall generators and other active circuit components.

U.S. Pat. No. 6,462,531 suggests, in a current detector using a Hall generator, a solution to the problem of how to guard the Hall generator from induction noise and external noise. The suggested solution is a noise shield in the form of a layer of electrically conductive and magnetic material, or electrically conductive and nonmagnetic material, or electrically insulating and magnetic material, overlying the Hall generator. As seen in a plan view, the noise shield is approximately the same in shape and size as the Hall generator.

This earlier solution has proved unsatisfactory, however, in shielding the required active components of the current detector other than the Hall generator. The second cited reference is totally silent on how such additional active semiconductor devices are shielded or, indeed, how they are structurally incorporated with the Hall generator at all. It is only clear that the suggested noise shield is constructionally insufficient to guard the additional active components.

SUMMARY OF THE INVENTION

It is therefore an object of this invention to shield both Hall effect element and associated active component or components of an integrated semiconductor current detector or the like against both external and internal noise, without in any way adversely affecting the sensitivity or other performance characteristics of the device.

Briefly, the invention may be summarized as a semiconductor device having a Hall effect element and at least one other active component for use as a current detector or the like. Included is a semiconductor substrate having formed therein the Hall effect element and said other active component which are both exposed in part at one of the pair of opposite major surfaces of the substrate. An electrically insulating layer is formed on this one major surface of the semiconductor substrate, and on this insulating layer is formed a shielding layer, preferably of highly electroconductive material, in overlying relationship to both the Hall effect element and the other active component for protecting the same from noise.

Preferably, a current-path conductor is arranged on the shielding layer via another insulating layer. As seen in a direction normal to the major surfaces of the substrate, the current-path conductor substantially encircles the Hall effect element, causing the same to generate a Hall voltage in proportion to the magnitude of a current flowing through the current-path conductor.

The semiconductor device of the foregoing broad construction takes the form of a current detector in a preferred embodiment of the invention. The current detector comprises, as active components in addition to the Hall effect element, a circuit for supplying a control current to the Hall effect element, and a circuit for putting out the Hall voltage generated by the Hall effect element. All these active components are exposed at one of the major surfaces of the semiconductor substrate and underlie the shielding layer, so that the active components are all protected by the shielding layer from noise due to the current-path conductor as well as from external disturbances. The current-path conductor is nevertheless positioned so close to the Hall effect element that the sensitivity of the current detector is not impaired by the provision of the shielding layer.

As an ancillary feature of the invention, a metal-made baseplate is attached to the other major surface of the semiconductor substrate. The noise immunity of the current detector is further enhanced by the coaction of the shielding layer and metal-made baseplate on the opposite major surfaces of the substrate.

It is also preferred that the shielding layer be grounded, as by connection to the metal-made baseplate. The shielding layer will then more efficaciously guard the active components from induction noise due to voltage variations in the current-path conductor.

The above and other objects, features and advantages of this invention will become more apparent, and the invention itself will best be understood, from a study of the following description and appended claims, with reference had to the attached drawings showing the preferred embodiment of the invention.

DESCRIPTION OF THE PREFERRED EMBODIMENT

Figure 1:
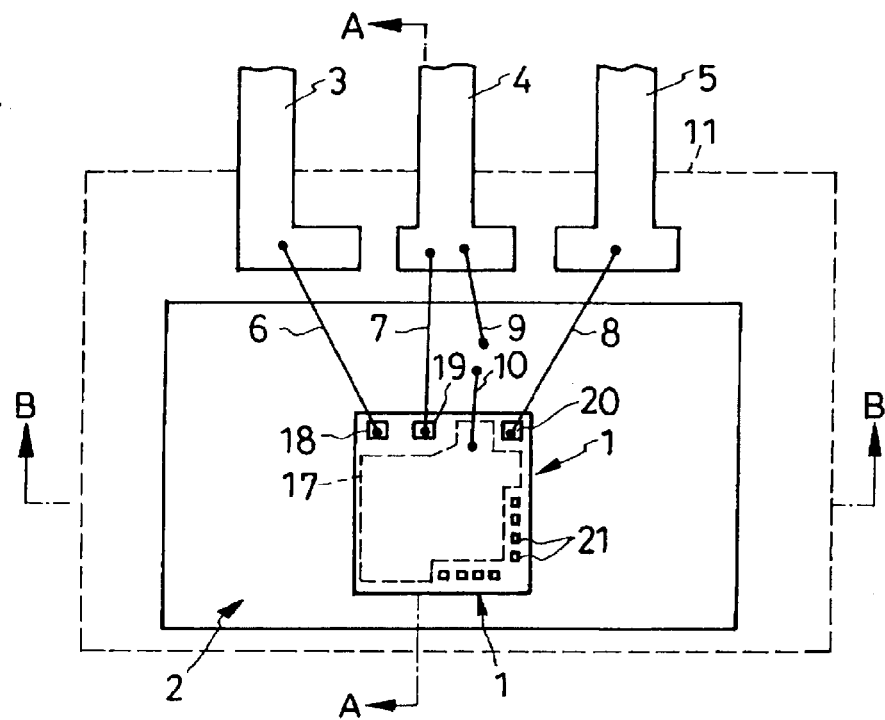
FIG. 1 is a plan view of the integrated semiconductor current detector embodying the principles of this invention.

The present invention will now be described as embodied in a current detector in the form of an integrated circuit semiconductor device including a Hall generator as a Hall effect element for current detection or measurement. With reference first to FIG. 1 the representative current detector broadly comprises:

1. An IC chip 1 having a Hall effect element or Hall generator and other active, as well as passive, components of the current detector formed in one piece therein.

2. A metal-made baseplate 2 as a mounting plate or supporting plate on which is firmly mounted the IC chip 1 by bonding.

3. Three sheet-metal terminals 3–5.

4. Four wire leads 6–9 connecting the sheet-metal terminals 3–5 to the required electric circuits built into the IC chip 1 as well as to the baseplate 2.

5. A plastic encapsulation 11 enveloping the whole of the IC chip 1 and baseplate 2 and parts of the terminals 3–5.

The plastic encapsulation 11 is depicted in phantom outline in FIG. 1 and does not appear in the subsequent figures because of its conventional nature.

As illustrated in more detail in FIGS. 2–5, the IC chip 1 comprises:

1. A substrate 12 of silicon or like semiconductor material having the Hall effect element or Hall generator and other component circuits of the current detector formed therein.

2. Four insulating layers 13–16, FIGS. 2 and 3, overlying the substrate 12 in lamination.

3. A shielding layer 17 interposed between the insulating layers 15 and 16 for electromagnetically shielding the Hall generator and other circuits of the current detector.

4. Three bonding pad terminals 18–20, FIG. 5.

5. A set of pads 21 for resistance measurement and adjustment.

6. A metal layer 22, FIGS. 2 and 3, on the substrate 12.

7. A current path conductor 23, FIGS. 3 and 4, of approximately horseshoe shape formed on the topmost insulating layer 16.

Figure 3:
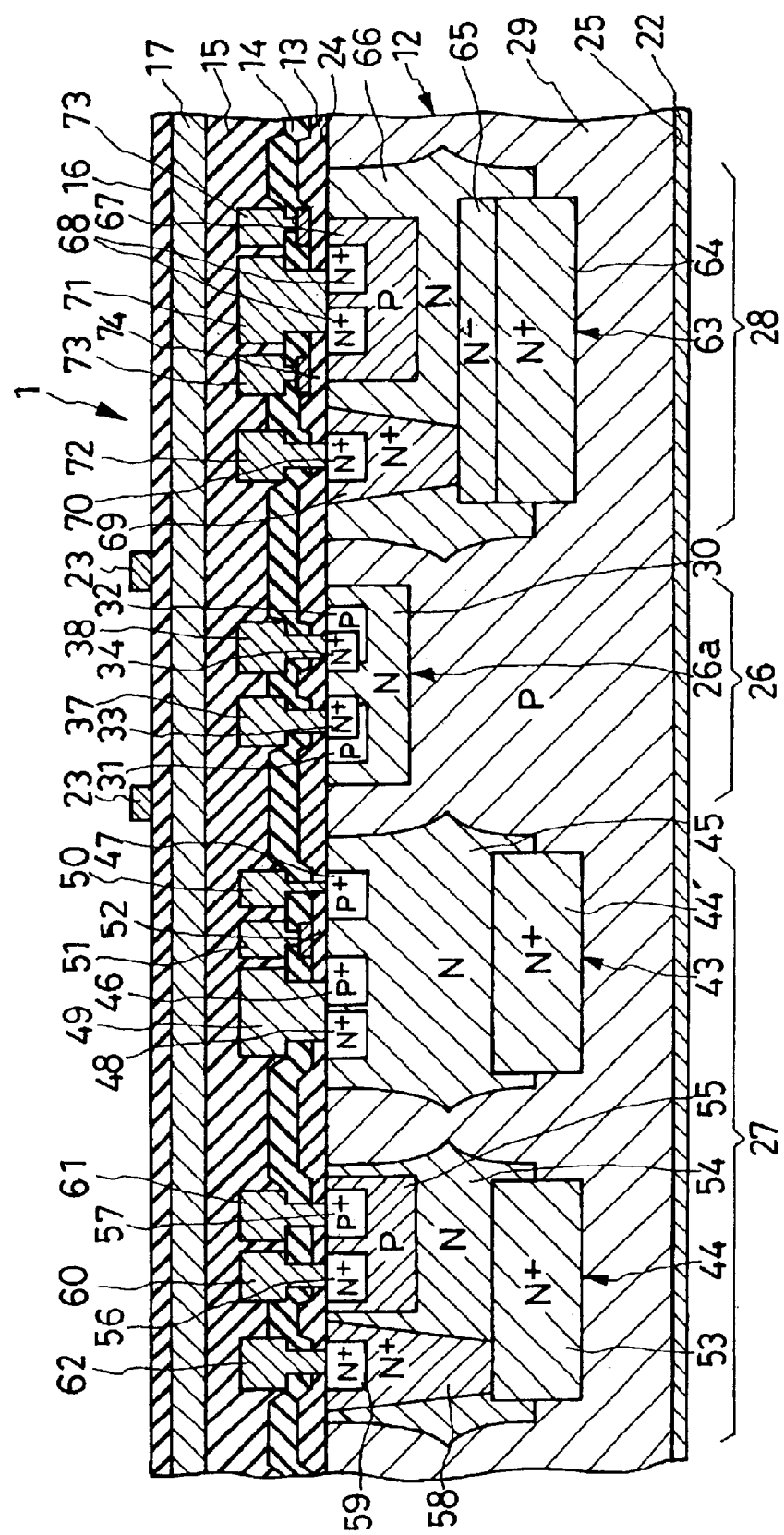
FIG. 3 is a still more enlarged, fragmentary section through the IC chip of the current detector, taken along the line B—B in FIG. 1.

FIG. 3 best indicates that the semiconductor substrate 12 has a pair of opposite major surfaces 24 and 25. The insulating layers 13–16 and shielding layer 17 overlie the major surface 24 of the substrate, and the metal layer 22 the other major surface 25.

Figure 4:
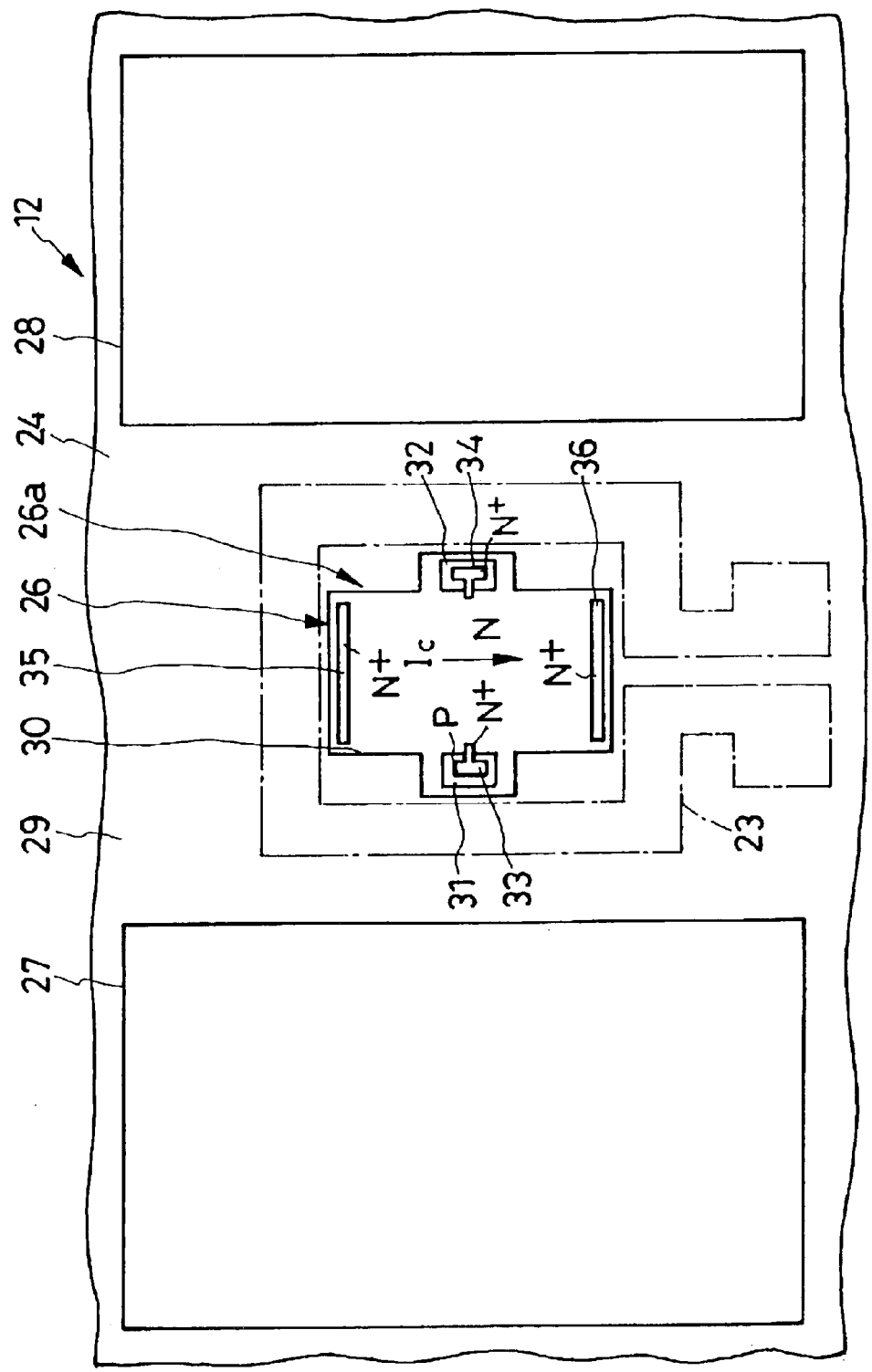
FIG. 4 is a diagrammatic, partial plan view of the IC chip of FIG. 3.

As will be better understood by referring also to FIG. 4, FIG. 3 further reveals that the semiconductor substrate 12 is broadly notionally divisible into three parts 26–28. The first part 26 of the substrate 12 has the Hall generator $26_a$ as Hall effect element formed therein. The second substrate part 27 contains both active and passive elements, some of which are not shown, constituting in combination a Hall voltage output circuit to be detailed subsequently. The third substrate part 28 has formed therein a circuit for delivering a control current to the Hall generator $26_a$. All the active components in the substrate parts 26–28 have mostly an n-type conductivity and are arranged in isolation from one another in a p-type region 29 constituting the semiconductor substrate 12.

With continued reference to both FIGS. 3 and 4 the Hall generator $26_a$ in the first substrate part 26 is formed to include an n-type semiconductor region 30, a pair of p-type semiconductor regions 31 and 32, a first pair of $n^+$-type semiconductor regions 33 and 34, and a second pair of $n^+$-type semiconductor regions 35 and 36.

As seen in a plan view as in FIG. 4, the n-type semiconductor region 30 is formed as a cross-shaped island in the p-type semiconductor region 29. The pair of p-type semiconductor regions 31 and 32 are formed as islands in the n-type semiconductor region 30 in the neighborhoods of the opposite ends of the side-to-side horizontal limb, as seen in FIG. 4, of the cross-shaped region 30. The first pair of $n^+$-type semiconductor regions 33 and 34 are formed as islands in the respective p-type semiconductor regions 31 and 32 and have parts jutting out into the n-type semiconductor region 30; that is, the first pair of $n^+$-type semiconductor regions 33 and 34 are contiguous to the n-type semiconductor region 30 under limitations imposed by the pair of p-type semiconductor regions 31 and 32. Higher in n-type impurity concentration than the n-type semiconductor region 30, the first pair of $n^+$-type semiconductor regions 33 and 34 serve for detection of the Hall voltage. Electrodes 37 and 38, FIGS. 3 and 6, are in ohmic contact with the first pair of $n^+$-type semiconductor regions 33 and 34, respectively, for connecting these semiconductor regions to the noted Hall voltage output circuit shown also in FIG. 6 and therein designated $27_a$.

The second pair of $n^+$-type semiconductor regions 35 and 36 are formed as elongate islands adjacent the opposite ends of the top-to-bottom horizontal limb, as seen in FIG. 4, of the cross-shaped region 30. The second pair of $n^+$-type semiconductor regions 35 and 36 are also higher in n-type impurity concentration than the n-type semiconductor region 30 and make ohmic contact with electrodes 39 and 40, FIGS. 3 and 6, respectively, thereby to be connected the control current supply circuit $28_a$. As indicated by the arrow in FIG. 4, this circuit $28_a$ conventionally operates to cause the familiar control current $I_c$ to flow across the n-type semiconductor region 30 either from one $n^+$-type semiconductor region 35 to the other $n^+$-type semiconductor region 36 of the second pair, or vice versa.

As is well known, a Hall voltage will develop between the first pair of $n^+$-type semiconductor regions 33 and 34 owing to the Hall effect when a magnetic field is applied at right angles with the control current $I_c$ flowing through the n-type semiconductor region 30 in either direction between the second pair of $n^+$-type semiconductor regions 35 and 36. Therefore, in the Hall generator $26_a$ as pictured in FIG. 4, that part of the n-type semiconductor region 30 which lies between the first pair of $n^+$-type semiconductor regions 33 and 34 and between the second pair of $n^+$-type semiconductor regions 35 and 36 may be considered the primary working part for generating the Hall voltage. More broadly, however, the entire n-type semiconductor region 30 may be considered the primary working part.

Figure 6:
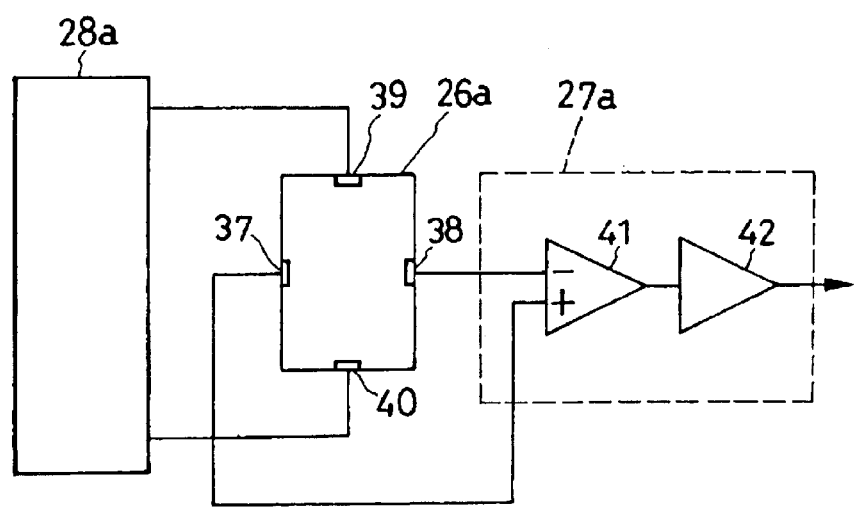
FIG. 6 is a schematic electric diagram of the current detector of FIG. 1.

Referring more specifically to FIG. 6, the first pair of $n^+$-type semiconductor regions 33 and 34 are connected via the electrodes 37 and 38 to a differential amplifier 41 and thence to an amplifier 42, which are both included in the Hall voltage output circuit $27_a$ forming a part of the IC chip 1 depicted in FIG. 3. Thus the Hall voltage between the first pair of $n^+$-type semiconductor regions 33 and 34 is detected by the differential amplifier 41 and put out via the amplifier 42.

With reference back to FIG. 3 the IC chip 1 has formed therein a p-channel insulated-gate field-effect transistor 43 and npn bipolar transistor 44 as active elements forming the Hall voltage output circuit $27_a$ of FIG. 6. Actually, however, both active and passive components are required in addition to the transistors 43 and 44 to make up the Hall voltage output circuit $27_a$. Such additional components are not shown by reason of their conventional nature and impertinence to the instant invention.

The field-effect transistor 43 comprises an n⁺-type layer 44' buried thoroughly in the semiconductor substrate 12, an n-type body region 45 extending from the major surface 24 of the semiconductor substrate down to the buried layer 44', and a p⁺-type source region 46, p⁺-type drain region 47 and n⁺-type ohmic contact region 48 which are all formed in the body region and exposed at the substrate major surface 24. The field-effect transistor 43 is furnished with a source electrode 49, a drain electrode 50 and a gate electrode 51. The source electrode 49 is in contact with the exposed surfaces of both source region 46 and ohmic contact region 48. The drain electrode 50 is in contact with the exposed surface of the drain region 47. The gate electrode 51 is disposed opposite, via an insulating film 52, that part of the n-type body region 45 which lies between source region 46 and drain region 47.

As shown also in FIG. 3, the bipolar transistor 44 comprises an n⁺-type buried layer 53 in the semiconductor substrate 12, an n-type collector region 54 extending from the substrate major surface 24 down to the buried layer 53, a p-type base region 55 formed in the collector region 54 and exposed at the substrate major surface 24, an n⁺-type emitter region 56 and p⁺-type ohmic region 57 which are both formed in the base region 55 and exposed at the substrate major surface 24, an n⁺-type collector lead-out region 58 extending from the substrate major surface 24 down to the buried layer 53, and an n⁺-type ohmic region 59 formed in the collector lead-out region 58 and exposed at the substrate major surface 24. The bipolar transistor 44 is also provided with an emitter electrode 60, a base electrode 61 and a collector electrode 62. The emitter electrode 60 is in contact with the exposed surface of the emitter region 56. The base electrode 61 is in contact with the base region 55 via the ohmic region 57. The collector electrode 62 is in contact with the collector region 54 via the ohmic region 59, lead-out region 58 and buried layer 53.

The third substrate part 28 for creation of the control current supply circuit $28_a$, FIG. 6, has formed therein a double-diffused insulated-gate field effect transistor (DMOSFET) 63. Other active and passive elements that are included in the control current supply circuit $28_a$ are not shown in FIG. 3.

The DMOSFET 63 comprises an n⁺-type buried layer 64 thoroughly embedded in the substrate 12, an n⁻-type buried layer 65 also embedded in the substrate into direct contact with the first buried layer 64, an n-type drain region 66 extending from the substrate major surface 24 down into contact with both buried layers 64 and 65, a p-type body region 67 formed in the drain region 66 and exposed at the substrate major surface 24, an n⁺-type source region 68 formed in the body region 67 and exposed at the substrate major surface 24, an n⁺-type collector lead-out region 69 extending from the substrate major surface 24 down to the buried layer 65, and an n⁺-type ohmic region 70 formed in the collector lead-out region 58 and exposed at the substrate major surface 24. Additionally, the DMOSFET 63 has a source electrode 71, a drain electrode 72 and a gate electrode 73. The source electrode 71 is in contact with the exposed surfaces of the body region 67 and source region 68. The drain electrode 72 is in contact with the drain region 66 via the ohmic region 70 and collector lead-out region 69. Annular in shape, the gate electrode 73 is disposed opposite the body region 67 via a gate insulating film 74.

It will have been noted that the Hall generator $26_a$ and three transistors 43, 44 and 63 shown in FIG. 3 are all exposed in part at the major surface 24, and spaced from the other major surface 25, of the semiconductor substrate 12. Their electrodes 37–40, 49–51, 60–62 and 71–73 are all electrically connected to conductors, not shown, between the insulating layers 14 and 15.

Figure 5:
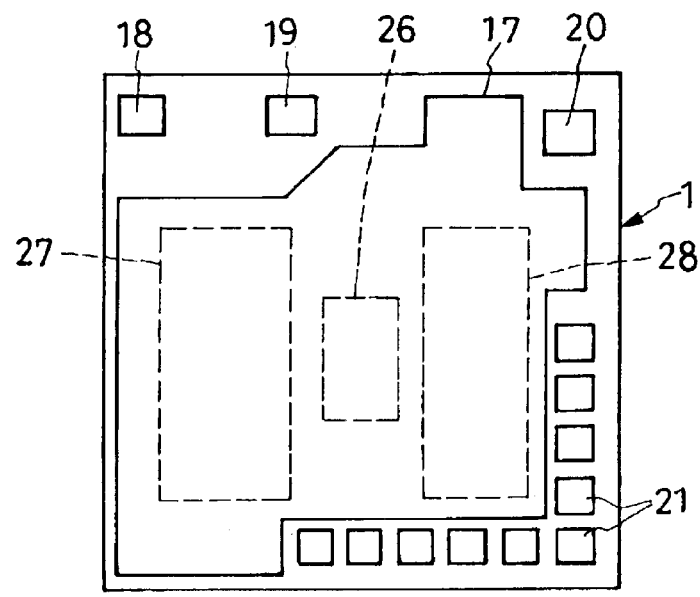
FIG. 5 is an enlarged plan view of the IC chip of FIG. 1 in a state immediately after the creation of the shielding layer thereon.

As will be understood from both FIGS. 3 and 5, the shielding layer 17 is formed on the insulating layer 15 in overlying relationship not only to the first part 26 of the semiconductor substrate 12 including the Hall generator $26_a$, as has been the case heretofore, but also both to the second substrate part 27 including the field-effect transistor 43 and bipolar transistor 44 and to the third substrate part 28 including the field-effect transistor. The shielding layer 17 is made from such metals of high electric conductivity as aluminum and molybdenum. It is understood that the shielding layer 17 is grounded.

FIG. 3 also reveals the current-path conductor 23 formed on the shielding layer 17 via the insulating layer 16. As seen in a plan view as in FIG. 4, the current-path conductor 23 is shaped so as to surround the n-type region 30 of the Hall generator $26_a$. The total thickness of the four insulating layers 13–16 on the major surface 24 of the semiconductor substrate 12 should be from about ten micrometers to about five millimeters for the best results.

Figure 2:
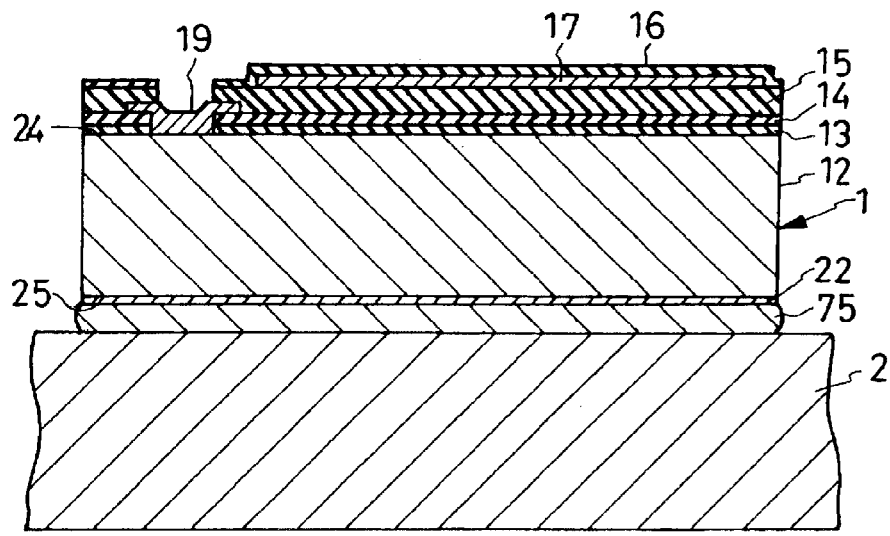
FIG. 2 is an enlarged, fragmentary section through the current detector, taken along the line A—A in FIG. 1.

The metal layer 22 on the other major surface 25 of the semiconductor substrate 12 is bonded to the metal-made baseplate 2, FIG. 2, via a layer 75 of electroconductive adhesive. As seen in a plan view as in FIG. 1, the baseplate 2 is considerably larger than the IC chip 1. The baseplate 2 is made from the sheet metal material such as sheet copper with a nickel plating.

The three sheet-metal terminals 3–5, FIG. 1, together with the baseplate 2 are made by sheet-metal punching. The first terminal 3 is used for putting out the Hall voltage, the second terminal 4 for grounding, and the third terminal 5 for application of drive voltages to the Hall generator $26_a$, Hall voltage output circuit $27_a$ and control current supply terminal $28_a$.

As seen also in FIG. 1, the IC chip 1 itself has three terminals 18–20 which, like the three sheet-metal terminals 3–5, serve for putting out the Hall voltage, grounding, and drive voltage application. The IC chip terminals 18–20 are electrically connected to the Hall voltage output circuit $27_a$ and control current supply circuit $28_a$ on the one hand and, on the other hand, to the sheet-metal terminals 3–5 via the wire leads 6–8. Additionally, the baseplate 2 is wired at 9 to the second terminal 4, and the shielding layer 17 wired at 10 to the baseplate 2, both for grounding. The known wire bonding method may be employed for the electric connections by the wires 6–10. The shielding layer 17 could be electrically connected to the second IC chip terminal 19 and thence to the second terminal 4, instead of being wired at 10 to the baseplate 2.

The series of pads 21 shown in FIG. 5 are designed for use in resistance measurement and adjustment by what is known as the Zener zapping method. A probe is placed in contact with the pads 21 for resistance measurement. For resistance adjustment by Zener zapping, on the other hand, there are employed Zener diodes connected in parallel with resistors, and a voltage in excess of the breakdown voltage is applied via the pads 21 to the selected Zener diodes thereby rupturing the diodes into mere conductors. Being put to use after the fabrication of the IC chip 1, these pads 21 are shown in FIG. 5 as being left unexposed by the shielding layer 17, as are the IC chip terminals 18–20.

The integrated-circuit current detector set forth hereinabove by way of a representative embodiment of the invention gains some distinct advantages over the prior art cited herein. As best seen in FIG. 3, the current-path conductor 23 is immovably mounted on the semiconductor substrate 12 via the insulating layers 13–16 having a total thickness in the specified range. This arrangement leads to the high sensitivity as the magnetic flux created by current flow through the current-path conductor 23 acts most effectively on the Hall generator $26_a$.

However, as the current-path conductor 23 is thus positioned close to the Hall generator $26_a$, so it is to the other active components of the current detector, such as the transistors 43, 44 and 63, as well as to the passive components and leads, all these other components being integrated with the Hall generator. It might be feared that such active and passive components might be affected by noise from the current-path conductor 23. This danger is effectively and inexpensively precluded by the shielding layer 17 which is compactly placed between semiconductor substrate 12 and current-path conductor 23 in overlying relationship not only to the Hall generator $26_a$ but also to the Hall voltage output circuit $27_a$ and control current supply circuit $28_a$. All the active and passive components included in these circuits as well as their connections are guarded against noise by electrostatic induction and from external noise.

Induction noise due to voltage variations in the current-path conductor 23 is effectively prevented as the shielding layer 17 is grounded via the baseplate 2 as in FIG. 1. The prevention of induction noise is made even more complete by the fact that the shielding layer 17 is made larger in size than heretofore and opposed to the current-path conductor 23 via the thin simulating layer 16 as in FIG. 3, resulting in the creation of an equivalence of a capacitor of relatively large capacitance.

Field noise is also favorably prevented as the semiconductor substrate 12 is mostly sandwiched between metal-made baseplate 2 and shielding layer 17.

With all these advantageous effects combined according to the invention, the current detector is materially enhanced in the reliability of performance. It is also an advantage that the current-path conductor is disposed outside of the IC chip.

Despite the foregoing detailed disclosure, it is not desired that the present invention be limited by the exact showing of the drawings or the description thereof. The following is a brief list of possible modifications, alterations and adaptations of the invention which are all believed to fall within the scope of the appended claims:

1. The shielding layer 17 could be wired directly to the second sheet-metal terminal 4 for grounding.

2. Another shield of magnetic material could be provided between metal-made baseplate 2 and semiconductor substrate 12.

3. Various active components other than, or in addition to, the Hall voltage output circuit $27_a$ and control current supply circuit $28_a$ could be created in the semiconductor substrate 12 in underlying relationship to the shielding layer 17.

4. The shielding layer 17 could be of various materials capable of electrostatic or electromagnetic shielding.

5. The current-path conductor 23 could be separate from the IC chip 1 instead of being an integral part of it as in the illustrated embodiment.

What is claimed is:

1. A semiconductor device having a Hall effect element and at least one other active component that is not a Hall effect element, comprising:
    (a) a semiconductor substrate having a pair of opposite major surfaces and having the Hall effect element and said other active component formed therein, the Hall effect element and said other active component being exposed in part at one of the major surfaces of the semiconductor substrate;
    (b) an electrically insulating layer formed on said one major surface of the semiconductor substrate; and
    (c) a shielding layer formed on the insulating layer in overlying relationship to both the Hall effect element and said other active component.

2. A semiconductor device as defined in claim 1, further comprising:
    (a) a second electrically insulating layer disposed on said shielding layer; and
    (b) a current-path conductor disposed on the second insulating layer and so positioned thereon as to cause a magnetic field to act on the Hall effect element with strength in proportion to the magnitude of a current flowing through the current-path conductor.

3. A semiconductor device as defined in claim 1, wherein the shielding layer is of electroconductive material and is grounded.

4. A semiconductor device as defined in claim 1, further comprising a metal-made baseplate attached to the other major surface of the semiconductor substrate for protecting the Hall effect element and said other active component from noise in cooperation with the shielding layer.

5. A noise-proof, integrated semiconductor current detector comprising:
    (a) a semiconductor substrate having a pair of opposite major surfaces;
    (b) a Hall effect element formed in the semiconductor substrate for providing a voltage proportional to the strength of a magnetic field applied, the Hall effect element being exposed at one of the pair of major surfaces of the semiconductor substrate;
    (c) a control current supply circuit formed in the semiconductor substrate and electrically connected to the Hall effect element for delivering a control current thereto, the control current supply circuit being exposed at said one major surface of the semiconductor substrate;
    (d) a Hall voltage output circuit formed in the semiconductor substrate and electrically connected to the Hall effect element for putting out the voltage generated by the Hall effect element, the Hall voltage output circuit being exposed at said one major surface of the semiconductor substrate;
    (e) an electrically insulating layer formed on said one major surface of the semiconductor substrate; and
    (f) a shielding layer formed on the insulating layer in overlying relationship to both the Hall effect element, the control current supply circuit and the Hall voltage output circuit.

6. A noise-proof, integrated semiconductor current detector as defined in claim 5, further comprising:
    (a) a second electrically insulating layer disposed on said shielding layer; and
    (b) a current-path conductor disposed on the second insulating layer and extending along the Hall effect element for causing the same to generate a voltage in proportion to the magnitude of a current flowing through the current-path conductor.

7. A noise-proof, integrated semiconductor current detector as defined in claim 5, further comprising a metal-made baseplate attached to the other major surface of the semiconductor substrate for protecting the Hall effect element, the control current supply circuit and the Hall voltage output circuit from noise in cooperation with the shielding layer.

8. A noise-proof, integrated semiconductor current detector as defined in claim 7, wherein the shielding layer is electrically connected to the baseplate.

* * * * *